(12) United States Patent
Sawada

(10) Patent No.: US 6,429,138 B1
(45) Date of Patent: *Aug. 6, 2002

(54) METHOD OF MANUFACTURING SEMICONDUCTOR DEVICE

(75) Inventor: Keiji Sawada, Nagasaki (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/188,353

(22) Filed: Nov. 10, 1998

(30) Foreign Application Priority Data

Nov. 11, 1997 (JP) .............................. 9-325383

(51) Int. Cl.$^7$ ............................ H01L 21/302
(52) U.S. Cl. ...................... 438/714; 438/689; 438/704
(58) Field of Search ..................... 228/180.22; 257/734, 257/737, 738; 438/689, 704, 666, 714, 584, 597, 612, 613

(56) References Cited

U.S. PATENT DOCUMENTS

| | | | | |
|---|---|---|---|---|
| 4,857,484 A | * | 8/1989 | Nishikawa | 438/106 |
| 5,172,212 A | * | 12/1992 | Baba | 257/738 |
| 5,366,589 A | * | 11/1994 | Chang | 156/657 |
| 5,525,546 A | * | 6/1996 | Harada et al. | 438/612 |
| 5,565,378 A | * | 10/1996 | Harada et al. | 438/106 |
| 5,661,082 A | * | 8/1997 | Hsu et al. | 438/612 |
| 5,731,243 A | * | 3/1998 | Peng et al. | 438/612 |
| 5,849,639 A | * | 12/1998 | Molloy et al. | 438/714 |
| 5,891,745 A | * | 4/1999 | Dunaway et al. | 438/18 |
| 5,897,374 A | * | 4/1999 | Lin | 438/666 |
| 5,904,154 A | * | 5/1999 | Chien et al. | 134/1.2 |
| 5,904,570 A | * | 5/1999 | Chen et al. | 438/725 |

OTHER PUBLICATIONS

Saito, S et al.; "A fine process control on the via hole of multilevel interconnection", VLSI Multilevel Interconnection Conference, 1989. Proceedings, Sixth International IEEE , 1989 , pp.: 432–438.*

* cited by examiner

Primary Examiner—John F. Niebling
Assistant Examiner—Christopher Lattin
(74) Attorney, Agent, or Firm—Sonnenschein, Nath & Rosenthal

(57) ABSTRACT

In manufacturing a semiconductor device, a metal polymer film and photoresist film are removed with an amine-based organic solvent subsequent to anisotropic etching of an insulating film on a bonding pad, an organic polymer film is removed with the oxygen plasma, and a wire is bonded to the bonding pad. In removal with the amine-based organic solvent, no aluminum oxide film is formed on the surface of the bonding pad. Pores are formed in the surface of the bonding pad upon removal, and the material of a wire bond enters these holes. As a result, a semiconductor device in which the wire bonded to the bonding pad hardly peels off can be manufactured.

6 Claims, 2 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device in which a wire is bonded to a bonding pad of an interconnection.

2. Description of the Related Art

Along with micropatterning and high-density integration of semiconductor devices, interconnections are also micropatterned and multilayered. However, micropatterning and multilayering interconnections decrease electromigration resistance and stress migration resistance. To avoid this, an aluminum-copper alloy is being used as a material of an interconnection instead of pure aluminum or an aluminum-silicon alloy which has conventionally been used.

One related art of a method of manufacturing a semiconductor device in which a gold wire is bonded to a bonding pad of an aluminum-copper alloy interconnection will be described with reference to FIGS. 1A to 2B. In this related art, as shown in FIG. 1A, an aluminum-copper alloy interconnection 12 having a bonding pad 12a is formed on an interlayer insulating film 11 on a semiconductor base (not shown). An insulating film 13 such as an SiO2 film is deposited by CVD to cover the interconnection 12.

As shown in FIG. 1B, a photoresist film 14 is applied to the insulating film 13, and an opening 14a is formed in the photoresist film 14 above the bonding pad 12a by photolithography. As shown in FIG. 1C, an opening 13a is formed in the insulating film 13 by etching using CFX-based reaction gas and the photoresist film 14 as a mask.

To vertically etch the insulating film 13 in forming the opening 13a, anisotropic etching is employed to form an organic polymer film 15 and metal polymer film 16 on the inner side surface of the opening 13a during etching, and to progress etching using the organic polymer film 15 and metal polymer film 16 as a mask.

The organic polymer film 15 is made of a reaction product upon reaction between the reaction gas and the materials of the photoresist film 14 and insulating film 13, contains many organic components, and is formed before the interconnection 12 is exposed. The metal polymer film 16 is made of a reaction product upon reaction among the reaction gas, the aluminum-copper alloy and the materials of the photoresist film 14 and insulating film 13, contains many metal components, and is formed after the interconnection 12 is exposed.

Even when the photoresist film 14 is removed with an organic solvent while the organic polymer film 15 and metal polymer film 16 are kept formed, they are not removed. The organic polymer film 15 and metal polymer film 16 are left on the inner side surface of the opening 13a or scattered onto the bonding pad 12a.

If a gold wire is bonded to the bonding pad 12a in this state, the bonded gold wire easily peels off because the organic polymer film 15 and metal polymer film 16 left on the inner side surface of the opening 13a decrease the bonding area or the organic polymer film 15 and metal polymer film 16 scattered onto the bonding pad 12a interfere with bonding.

In this related art, therefore, the photoresist film 14 in the state of FIG. 1C is removed by a predetermined thickness with the oxygen plasma. Then, as shown in FIG. 1D, the remaining photoresist film 14 and metal polymer film 16 are removed with an amine-based organic solvent. As shown in FIG. 2A, the organic polymer film 15 is removed with the oxygen plasma. As shown in FIG. 2B, a gold wire 18 is bonded to the bonding pad 12a via a gold wire bond 17.

In the above related art, however, since the photoresist film 14 is removed by a predetermined thickness with the oxygen plasma, and then the remaining photoresist film 14 and metal polymer film 16 are removed with the amine-based organic solvent, an aluminum oxide film has already been formed on the surface of the bonding pad 12a in removal with the amine-based organic solvent.

The aluminum oxide film functions as a mask against the amine-based organic solvent. Even by removal with the amine-based organic solvent, the aluminum oxide film remains on the surface of the bonding pad 12a, and the surface of the bonding pad 12a is kept smooth. In addition, along with micropatterning and high-density integration of semiconductor devices, the area of the bonding pad 12a and the diameter of the gold wire bond 17 are decreased.

For this reason, in this related art, the gold wire 18 bonded to the bonding pad 12a easily peels off. Therefore, the semiconductor device cannot be manufactured with a high yield. In addition, the area of the bonding pad 12a and the diameter of the gold wire bond 17 are difficult to decrease, and a fine semiconductor device having a high integration degree cannot be manufactured.

SUMMARY OF THE INVENTION

It is therefore an object of the present invention to provide a semiconductor device manufacturing method capable of preventing peeling of a wire bonded to a bonding pad of an interconnection to allow the manufacture of a semiconductor device with a high yield and to decrease the area of the bonding pad and the diameter of a wire bond to allow the manufacture of a fine semiconductor device having a high integration degree.

In the semiconductor device manufacturing method according to the present invention, a metal polymer film formed on the inner side surface of the opening of an insulating film by anisotropic etching of the insulating film is removed with an amino group ($NH_2$—) in an amine-based organic solvent, while a photoresist film is removed with the organic solvent component in the amine-based organic solvent. This removal with the amine-based organic solvent is performed subsequent to anisotropic etching of the insulating film.

As a result, the bonding pad of an interconnection is free from any oxygen plasma processing till removal with the amine-based organic solvent after the bonding pad is exposed in the opening of the insulating film by anisotropic etching of the insulating film. No aluminum oxide film is formed on the surface of the bonding pad of the interconnection in removal with the amine-based organic solvent.

Along with removal using the amine-based organic solvent, the amino group ($NH_2$—) in the amine-based organic solvent enters the interface between aluminum and copper of an aluminum-copper alloy in the bonding pad, and highly ionizable aluminum elutes. As the elution progresses, copper crystal grains come out of the aluminum-copper alloy to form pores in the surface of the bonding pad upon removal.

An organic polymer film formed on the inner side surface of the opening of the insulating film by anisotropic etching of the insulating film is also removed with the oxygen plasma, and then a wire is bonded to the bonding pad. In bonding, no metal polymer film or organic polymer film exists on the bonding pad.

More specifically, since no metal polymer film or organic polymer film exists on the bonding pad in bonding, the metal polymer film and organic polymer film do not decrease the bonding area or interfere with bonding. In bonding, since pores are formed in the surface of the bonding pad, the material of the wire bond enters these pores. Therefore, the wire bonded to the bonding pad of the interconnection hardly peels off.

Since the wire bonded to the bonding pad of the interconnection hardly peels off, the semiconductor device can be manufactured with a high yield, and the area of the bonding pad and the diameter of the wire bond can be decreased to manufacture a fine semiconductor device having a high integration degree.

In a preferred semiconductor device manufacturing method according to the present invention, the time for removing, with the oxygen plasma, the organic polymer film formed on the inner side surface of the opening of the insulating film by anisotropic etching of the insulating film is set to 10 to 40 min. The organic polymer film can be satisfactorily removed, while formation of the aluminum oxide film on the surface of the bonding pad can be reliably prevented even upon this removal.

For this reason, the wire bonded to the bonding pad of the interconnection more hardly peels off without any interference by the aluminum oxide film on the surface of the bonding pad.

Since the wire bonded to the bonding pad of the interconnection more hardly peels off, the semiconductor device can be manufactured with a higher yield, and the area of the bonding pad and the diameter of the wire bond can be further decreased to manufacture a finer semiconductor device having a higher integration degree.

DETAILED DESCRIPTION OF THE PREFERRED EMBODIMENT

Figure 1A:
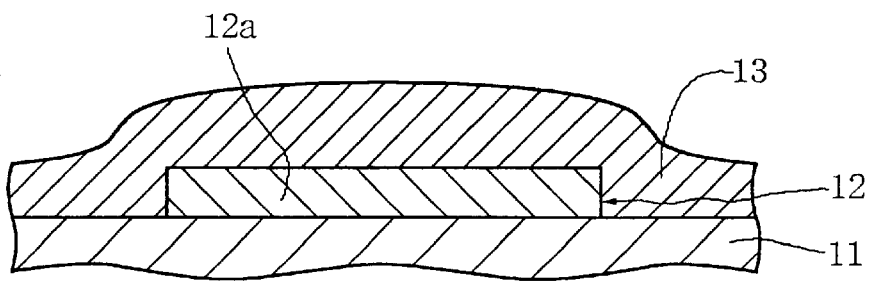
FIGS. 1A to 1D are side sectional views, respectively, showing the first half steps in manufacturing a semiconductor device in which a wire is bonded to the bonding pad of an aluminum-copper alloy interconnection.

An embodiment of the present invention applied to a method of manufacturing a semiconductor device in which a gold wire is bonded to a bonding pad of an aluminum-copper alloy interconnection will be described with reference to FIGS. 1A to 2B. In this embodiment, as shown in FIG. 1A, an interlayer insulating film 11 made up of a 300-nm thick $SiO_2$ film deposited by CVD using TEOS as a raw material, and an overlying 700-nm thick BPSG film is formed on a semiconductor base (not shown).

A 500-nm thick interconnection 12 made of an aluminum-copper alloy at Al:Cu=99.5%:0.5% and having a bonding pad 12a is formed. The interconnection 12 is covered with an insulating film 13 made up of a 300-nm thick $SiO_2$ film deposited by CVD using TEOS as a raw material, a overlying 700-nm thick BPSG film and a further overlying 700-nm thick SiN film.

Figure 1B:
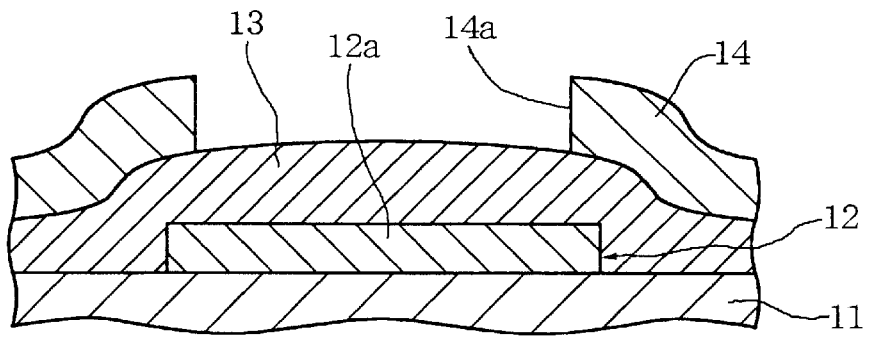
Figure 1C:
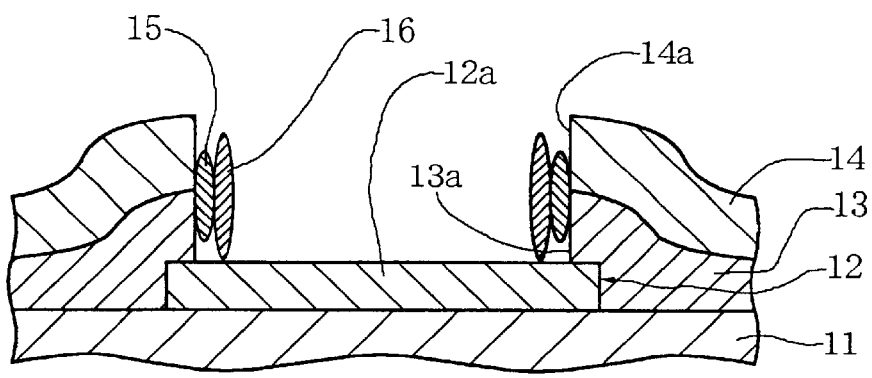

As shown in FIG. 1B, a 3.0-$\mu$m thick photoresist film 14 is applied to the insulating film 13, and an opening 14a is formed in the photoresist film 14 above the bonding pad 12a by photolithography. As shown in FIG. 1C, an opening 13a is formed in the insulating film 13 by anisotropic etching using $CF_x$-based reaction gas and the photoresist film 14 as a mask under the following conditions. Etching conditions for insulating film 13

Etching apparatus: TE5000 (available from Tokyo Electron)

Gas: $CF_4$/Ar=100 sccm/450 sccm

Pressure: 307 Pa

Radiofrequency output: 600 W

Processing time: 129 sec

Figure 1D:
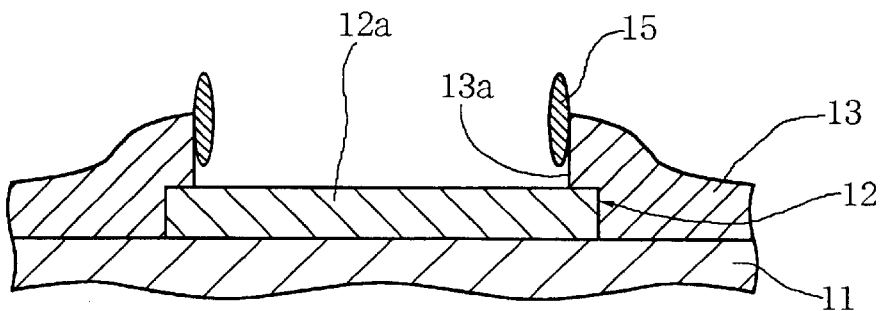

During this etching, an organic polymer film 15 and metal polymer film 16 are formed on the inner side surface of the opening 13a. As shown in FIG. 1D, the photoresist film 14 and metal polymer film 16 are removed with an amine-based organic solvent under the following conditions. Removal conditions for photoresist film 14 and metal polymer film 16

Removal apparatus: WSST (available from Semitool)

Removal solution: EKC-265 (available from EKC)

Temperature: 60° C.

Processing time: 15 min

Composition of EKC-265

2-(2-aminoethoxy)ethanol:55% hydroxyamine:20% catechol:5% water:20%

Since removal with the amine-based organic solvent is performed subsequent to anisotropic etching of the insulating film 13, the bonding pad 12a is free from any oxygen plasma processing till removal with the amine-based organic solvent after the bonding pad 12a is exposed in the opening 13a by anisotropic etching of the insulating film 13. Therefore, no aluminum oxide film is formed on the surface of the bonding pad 12a in removal with the amine-based organic solvent.

Figure 2A:
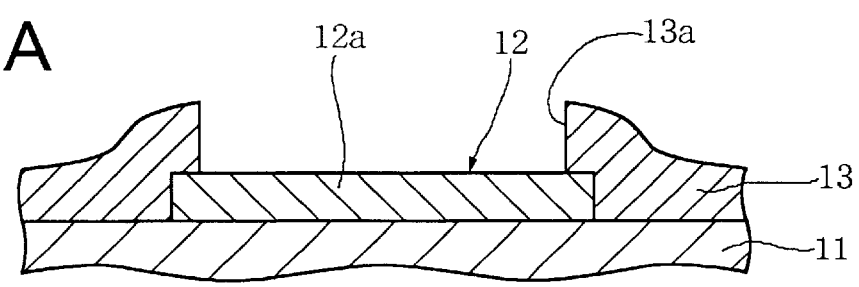
FIGS. 2A and 2B are side sectional views, respectively, showing the second half manufacturing steps.

The amino group ($NH_2$—) in the amine-based organic solvent enters the interface between aluminum and copper of the aluminum-copper alloy in the bonding pad 12a, and highly ionizable aluminum elutes. As the elution progresses, copper crystal grains come out of the aluminum-copper alloy to form pores in the surface of the bonding pad 12a upon removal. Then, as shown in FIG. 2A, the organic polymer film 15 is ashed away with the oxygen plasma under the following conditions. Ashing conditions for organic polymer film 15

Ashing apparatus: RAM250 (available from RAMCO)

Gas:$O_2$=800 sccm

Pressure:106.4 kPa

Radiofrequency output:1,000 W

Processing time:25 min

Removing the organic polymer film 15 requires an ashing time of 10 min or more. If ashing is performed for 40 min or more, an aluminum oxide film is formed on the surface of the bonding pad 12a exposed in the opening 13a. The presence of the aluminum oxide film decreases the adhesive force of a gold wire bond 17 and interferes with bonding.

That is, with an ashing time of 10 to 40 min, and more preferably, 20 to 30 min, the organic polymer film 15 can be satisfactorily removed, while formation of the aluminum oxide film on the surface of the bonding pad 12a can be reliably prevented even upon this removal. This embodiment therefore employs an ashing time of 25 min.

Figure 2B:
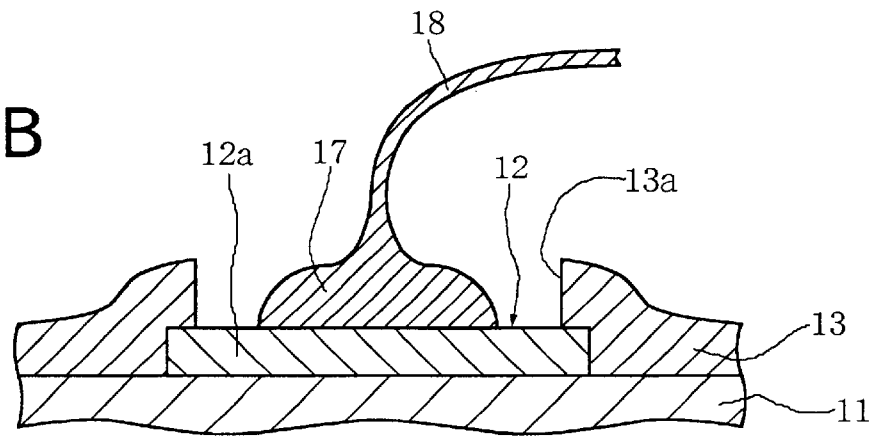

As shown in FIG. 2B, a gold wire 18 is bonded to the bonding pad 12a via the gold wire bond 17. Since pores are formed in the surface of the bonding pad 12a, gold as a material of the gold wire bond 17 enters these pores.

Accordingly, in the semiconductor device manufactured in this embodiment, the gold wire 18 hardly peels off.

In the above embodiment, the present invention is applied to a method of manufacturing a semiconductor device in which the gold wire 18 is bonded to the bonding pad 12a of the aluminum-copper alloy interconnection 12. The present invention can also be applied to a method of manufacturing a semiconductor device in which an Al wire or the like is bonded.

What is claimed is:

1. A method of manufacturing a semiconductor device, comprising the steps of:

covering an interconnection having a bonding pad with an insulating film;

forming a photoresist film having a first opening above the bonding pad on the insulating film;

forming a second opening in the insulating film below the first opening by anisotropic etching using the photoresist film as a mask;

removing a metal polymer film and an organic polymer film formed on an inner side surface of the second opening, said removing step consisting of:

removing, with an amino group of an amine-based organic solvent, subsequent to the anisotropic etching, the metal polymer film formed on an inner side surface of the second opening by the anisotropic etching and the photoresist film while simultaneously removing said photoresist film with an organic solvent component of said amine-based organic solvent;

removing, with an oxygen plasma, the organic polymer film formed on the inner side surface of the second opening by the anisotropic etching after removal with the amine-based organic solvent; and bonding a wire to the bonding pad after removal with the oxygen plasma.

2. A method as claimed in claim 1, wherein the interconnection contains aluminum.

3. A method as claimed in claim 1, wherein the interconnection is made of an aluminum-copper alloy.

4. A method as claimed in claim 1, wherein the removal with the oxygen plasma is performed for 10 to 40 min.

5. A method as claimed in claim 1, wherein the removal with the oxygen plasma is performed for 20 to 30 min.

6. A method as claimed in claim 1, wherein said amine-based organic solvent also enters an interface between aluminum and copper of an aluminum-copper alloy in the bonding pad, so that highly ionizable aluminum elutes to form pores in the surface of the bonding pad.

\* \* \* \* \*